MULTIPLE-PATH ELECTRONIC COMPONENT

Filed Jan. 18, 1966 3 Sheets-Sheet 1

INVENTORS
BERNARD L. GEDDRY
MARTIN E. MEHRON
MAURICE R. COTE
JOHN C. CALLAHAN
BY
ATTORNEY

INVENTORS
BERNARD L. GEDDRY
MARTIN E. MEHRON
MAURICE R. COTE
JOHN C. CALLAHAN
BY
ATTORNEY

INVENTORS
BERNARD L. GEDDRY
MARTIN E. MEHRON
MAURICE R. COTE
JOHN C. CALLAHAN
BY
ATTORNEY 3,474,358

MULTIPLE-PATH ELECTRONIC COMPONENT

Bernard L. Geddry, Canton, Mass., and Martin E. Mehron, Maurice R. Cote, and John C. Callahan, Nashua, N.H., assignors to Sanders Associates, Inc., Nashua, N.H., a corporation of Delaware Filed Jan. 18, 1966, Ser. No. 521,391
Int. Cl. H01p 5/12, 1/14, 1/04
U.S. Cl. 333—7 18 Claims

ABSTRACT OF THE DISCLOSURE

A multiple lead diode unit is presented which comprises a plurality of semiconductor wafers bonded to a common conductor in a circular planar fashion and extending in a radial direction. Each of the semiconductor wafers is oriented such that they are forward biased in a common direction and a lead wire is fastened to the free end of the semiconductor wafer. This structure is then encapsulated in a glass envelope with only the radial leads and the common lead extending through and beyond the envelope. This diode device is incorporated within a microwave unit and when each of the semiconductor leads is properly biased, the semiconductor conducts electrical energy, otherwise, the semiconductor will reflect the electrical energy. In this manner, the microwave unit becomes a multiple throw switch.

This invention relates to a multiple-path high frequency diode unit and to a microwave switch employing the unit.

Schematically, the multiple-path diode unit comprises a plurality of semiconductor rectifying devices, each having one terminal connected to a common conductor. However, the structure of the diode unit is such that it has unusually low reactance, particularly inductance, between the common conductor and each rectifying device. The diode unit is therefore capable of multiple-path switching with signal wavelengths at least as short as the low centimeter range, i.e., at least up to $10^{10}$ Hz.

The microwave switch provided by the invention makes use of this capability of the multiple-path diode unit. The switch operates over frequency ranges several times greater than those of prior art switches and provides more than a ten-fold saving in weight and size over existing diode switches.

Compared with mechanical switches, semiconductor diode switches offer advantages in opearting speed, weight and size. However, impedance mismatches have limited the frequency bandwidth and the upper frequency limit of prior multiple-path, i.e., single pole, multiple-throw diode switches. Such a switch transfers a signal on a common conductor to any one of several branch paths by forward-biasing a diode in the selected path and back-biasing diodes in the remaining paths. The switch can also operate in the other direction, coupling the signal on any branch path to the common conductor.

The input impedance at the common conductor of a multiple-path diode switch depends on the impedance of the forward-biased rectifying device as well as on the impedance of the back-biased rectifying devices. In the ideal switch, the "on" branch path has a reactance-free impedance equal to a design characteristic impedance, and the impedance of each "off" branch path has a much higher reactance-free value. However, this goal is only approached in practice.

One departure from the ideal impedance is due to the impedance reflected from the lead between the common conductor and each back-biased diode. This lead appears to the common conductor as an open circuited stub. When the signal frequency increases to where this lead is a quarter-wavelength long, the input impedance of the diode approaches zero.

Further, the detrimental effect of the lead to each diode increases as the characteristic impedance of the lead is reduced. Yet a low characteristic impedance is generally desired to match the diode to the conventional 50- to 100-ohm impedance of its adjoining transmission line.

Increasing the number of branch paths in the switch aggravates the foregoing impedance problems. Thus, a five-path switch generally has had a lower maximum operating frequency and a narrower frequency band than a four-path switch of the same construction.

Efforts to reduce the length of the lead between the common conductor and each diode are limited by the size of encapsulated diodes. Also, increasing the number of branch paths makes it increasingly difficult to cluster the diodes close around the common conductor.

Accordingly, it is an object of the present invention to provide improved apparatus for switching a microwave signal between a common conductor and any one or more of a plurality of signal paths.

Another object of the invention is to provide multiple-path diode switching apparatus efficiently operable over a wider range of frequencies than prior diode switches.

Another object is to provide multiple-path diode switching apparatus that operates efficiently at higher frequencies than prior diode switches.

A further object of the invention is to provide a multiple-path parallel diode circuit having less lead inductance between the common conductor and a diode in each path than prior circuits.

It is also an object of the invention to provide an improved microwave component for multiple-branching logic operation.

Other objects of the invention will in part be obvious and will in part appear hereinafter.

The invention accordingly comprises the features of construction, combinations of elements, and arrangements of parts which will be exemplified in the constructions hereinafter set forth, and the scope of the invention will be indicated in the claims.

For a fuller understanding of the nature and objects of the invention, reference should be had to the following detailed description taken in connection with the accompanying drawings, in which.

The problems discussed above can be solved to a large extent with a new multiple-path semiconductor diode unit in which each of a plurality of rectifying devices has one element mounted directly on a common conductor. The rectifying devices generally are symmetrically arranged, as on a curved or surface path, relative to the axis of the common conductor. A single envelope encloses all the rectifying devices. The connection from the other element of each rectifying device extends from the envelope together with a terminal portion of the common conductor.

This arrangement essentially removes the lead between the common conductor and each rectifying device. It thus provides a multiple-fold increase in the upper operating frequency of the diode unit. Also, the multiple-path diode unit operates over a considerably wider frequency range than was heretofore possible.

Figure 1:
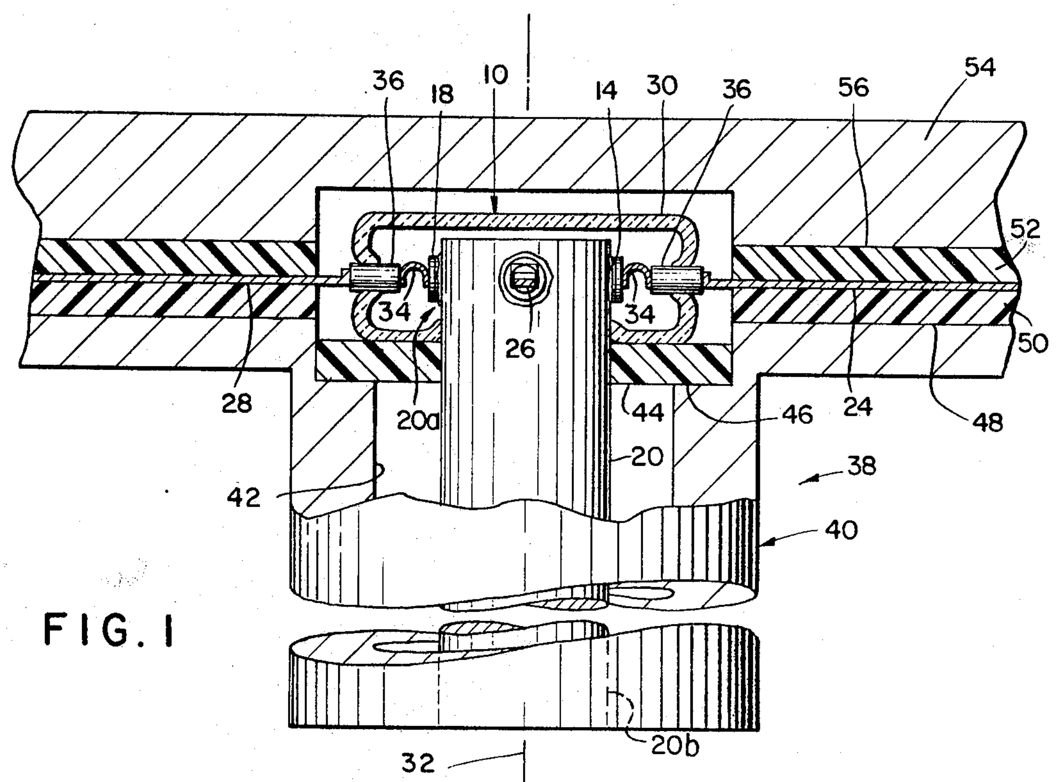
FIG. 1 is a side elevation view, partly broken away, of a mounted multiple-path diode unit embodying the invention.
Figure 2:
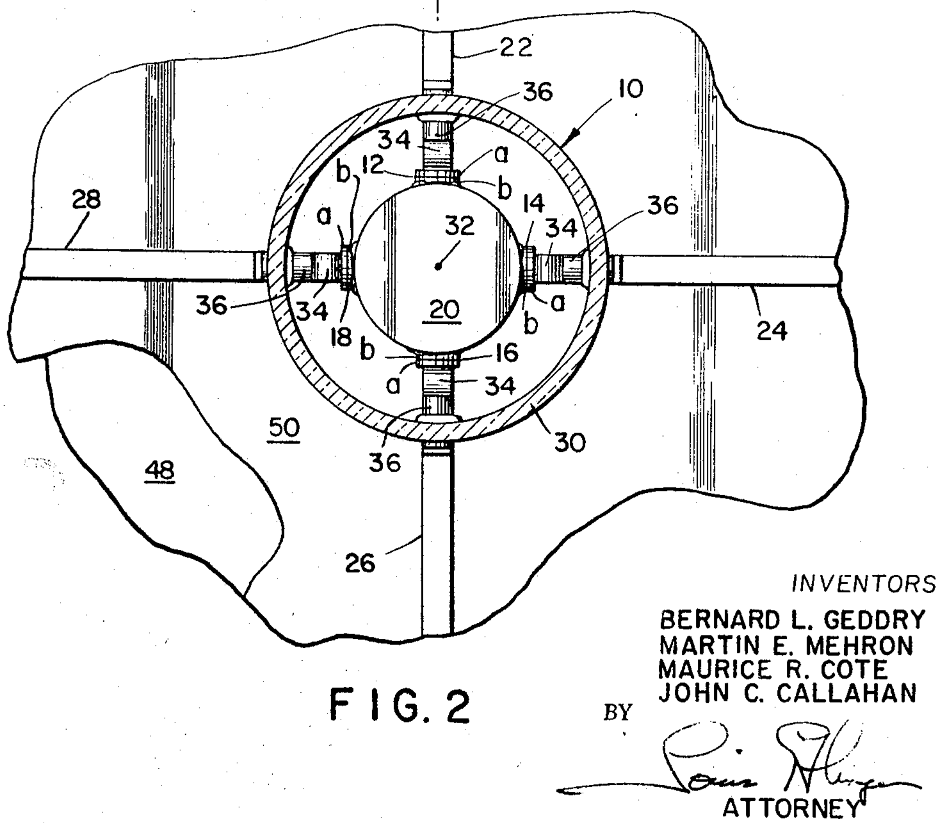
FIG. 2 is a top view of the mounted diode unit of FIG. 1 with the top portion of the mount removed and the glass enclosure broken away.

More specifically, as shown in FIGS. 1 and 2, a four-path diode unit 10 has four diodes 12, 14, 16 and 18, each having an anode element and a cathode element. The term "diode" used in relation to references 12, 14, 16, and 18 means a semiconductor wafer, such as P–N junction material, that is without interconnecting leads bonded thereto, and the wafer is not encapsulated in glass or any other protective covering. This semiconductor wafer will be referred to hereafter as a "diode." One element of each diode, illustrated as the cathode element *b*, is mounted directly on a conductive post 20 that serves as a common conductor for the four diodes 12–18.

An electric lead 22 is connected to the anode element 12*a* and extends radially outward from the post 20. Leads 24, 26 and 28 are likewise connected to the anode elements 14*a*, 16*a* and 18*a* respectively and extend outwardly like spokes from a hub. The four leads 22–28 extend beyond a glass envelope 30 that encloses the diodes and the upper portion 20*a* of the post 20.

A preferred diode 12–18 is a PIN junction diode. Semiconductor diodes of the point contact germanium type, as well as others, and also junction and/or rectifying devices such as varactors and tunnel diodes can be used, according to the electrical characteristics desired for the diode 10. And in general, any semiconductor circuit element, including a transistor, having appropriate geometry, can be assembled on a common conductor in accordance with the invention. The rectifying devices are mounted on the conductive post 20 as by bonding with an electrically conductive epoxy cement. They can alternatively be fabricated directly on the conductive post by integrated circuit techniques. Also, a common conductor having a configuration other than the illustrated rod-shaped post 20 can be used; a planar conductor is an example.

The rectifying devices are equally spaced along a circular right cylindrical surface of the post. This disposes them symmetrically with respect to the terminal portion 20*b* of the post (FIG. 1) and equally spaced from its central longitudinal axis 32 so that the signal paths from the post terminal portion 20*b* to every lead 22–28 are of the same electrical length.

Moreover, there are no branches in the common conductor between the terminal portion 20*b* and the surface segments to which the diodes are secured. That is, there are no insulators separating the geometrically shortest conductive paths between each surface segment and the center of the common conductor or its terminal portion. As a consequence of this branch-free common conductor structure, a substantially frequency-independent impedance appears at the terminal portion when one or more diodes together have an impedance that matches the impedance at the terminal portion over the operating bandwidth, and the remaining diodes have considerably higher impedances over the same bandwidth.

As also shown in FIGS. 1 and 2, the anode element *a* of each diode 12–18 is on the side of the cathode element *b* opposite from the post 20 and is hence isolated from the post when the diode is back-biased. Conductive leaf springs 34—34 are interposed between the diode anode elements and short feed-through pins 36—36. The pins 36—36 pass through the envelope 30, preferably with a hermetic seal, and connect to the associated leads 22–28. The envelope 30 also preferably forms a hermetic seal with the post 20.

By way of illustration, the four-path diode unit 10 can have an overall outer diameter measured at the outer wall of the glass envelope 30 of less than ¾ centimeter, and the conductive post 20 can be a small wire, appropriately No. 16.

The multiple-path diode unit 10 thus has essentially no lead length between the common conductor and each diode. It is more precise, perhaps, to consider the diode unit as having a lead length that takes into account the cross-sectional size of the common conductor and the skin depth of the alternating currents on the common conductor. In any event, the frequency capability of the multiple-path diode is limited by the junction capacitances of the diodes. It is no longer limited by the interconnecting leads with presently available diode structures.

With further reference to FIGS. 1 and 2, the diode unit 10 can be incorporated in a microwave circuit with a relatively simple structure. For use in the strip transmission line mount 38 now to be described, the leads 22–28 are thin, ribbon-like strips that form the inner conductors of branch transmission lines.

The mount 38 has an electrically conductive housing member 40 that forms a cylindrical transmission line outer conductor 42 coaxial with the post 20. The post 20 is thus the inner conductor of a coaxial transmission line feed path for the diode unit 10. A dielectric disk 44, seated against a shoulder 46 formed by a counterbore in the outer conductor 42 at its end adjacent the diode unit 10, supports the envelope 30 and the post 20. Above the shoulder 46, the housing member 40 is radially flared to form a planar strip transmission line ground plane conductor 48 parallel to the leads 22–28. An insulating sheet 50 fills the narrow space between the leads and the ground plane conductor 48 according to conventional strip line techniques. A like insulating sheet 52 is on the other side of the leads 22–28.

The mount 38 also includes an electrically conductive top plate 54 over the insulating sheet 52 and secured to the housing member 40. The top plate forms a second ground plane conductor 56 for the branch transmission line paths and is electrically connected to the housing member 40 so as to be at the same microwave potential as the ground plane conductor 48.

This construction of the mount 38 provides a well matched transition between the transmission line feed path formed by conductors 20 and 42 and each transmission line branch path comprising one lead 22–28 as the inner conductor.

Figure 3:
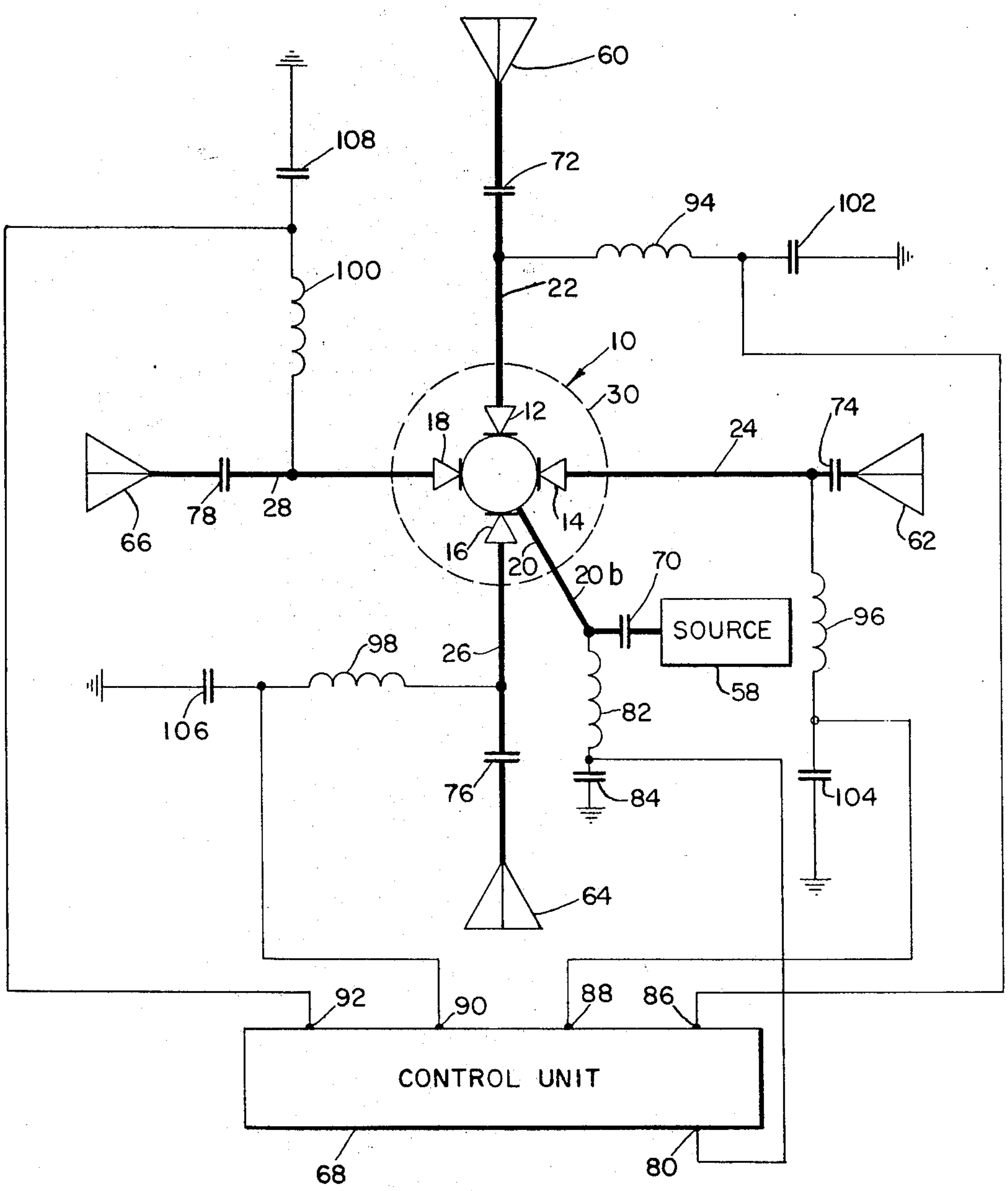
FIG. 3 is a schematic representation of a single-pole four-throw microwave switch embodying the invention.

In FIG. 3, a microwave switch employing the multiple-path diode unit 10 couples the signal from a microwave source 58 to any one or more utilization devices 60, 62, 64 and 66, illustrated as antennas. A control unit 68 biases the diodes 12–18 independently from each other to establish the conduction path through the switch.

The heavy lines in FIG. 3 indicate inner conductors of transmission lines. The outer conductors are not shown; they can employ conventional constructions such as shown in FIGS. 1 and 2.

The signal from the source 58 is applied to the terminal portion 20*b* of the post 20 through a D.C. blocking capacitor 70. Similarly, a blocking capacitor 72 is in series between the end of the lead 22 and the antenna 60 and blocking capacitors 74, 76 and 78 are in series between the antennas 62, 64, 66 and the leads 24, 26 and 28 respectively.

The control unit 68 has a common terminal 80 connected through a radio frequency choke 82 to the post 20. A bypass capacitor 84 shunts to ground microwave signals that leak past the choke 82. The control unit also has four control terminals 86, 88, 90 and 92, at which it develops four control voltages with respect to the common terminal 80, for independently controlling each of the diodes 12–18.

In another embodiment, bypass capacitor 84 is not used. The control unit common terminal 80 is connected directly to ground, as is R.F. choke 82. Choke 82 is then called a "D.C. return," i.e., the control unit ground is coincident with the R.F. ground.

R.F. chokes 94, 96, 98 and 100 are connected between the control terminals 86, 88, 90 and 92 and the diode leads 22, 24, 26 and 28, respectively, to apply the control voltages to the diode anode elements. The R.F. chokes 82 and 94–100 can be lumped parameter inductance elements. Transmission line inductances, as formed by thin, relatively high impedance wires or by resonant stubs each having a capacitive short circuit at the end remote from the connection to the diode lead, can also be used. In the latter construction, the capacitive short circuits provide the bypass capacitors 84, 102, 104, 106 and 108.

With further reference to FIG. 3, during transmitting operation with the illustrated switch, when the signal from the source 58 is to be applied to the antenna 64 and isolated from the remaining antennas, the control unit is operated to develop a positive voltage, relative to the common terminal 80, at its control terminal 90. This control voltage forward-biases the diode 16 to provide a low impedance path from the post 20 to the lead 26 and hence on to the antenna 64.

At the same time, the control unit develops voltages at the other control terminals 86, 88 and 92, which are negative relative to the common terminal 80. These negative control voltages reverse-bias the diodes 12, 14 and 18 so that the transmission line paths incorporating them present relatively high impedances to the signal on the post 20.

The switch therefore couples the microwave signal from the source 58 to the antenna 64 with low loss, illustratively considerably under 1.5 db over a frequency range from 1 gHz. to 6 gHz. The input impedance of the switch presented to the source 58 remains low throughout such a wide frequency band. Further, the antennas 60, 62 and 66 coupled to the leads 22, 24, and 28 are fairly well isolated, i.e., by a minimum of 10 db from the source of the 6:1 frequency range.

The switch of FIG. 3 is bi-directional in that it can also supply the signal received at any one or more of the antennas 60–66 to the post 20. For this operation, the source 58 is, of course, replaced with a utilization device such as radio receiving equipment.

Figures 4, 5:
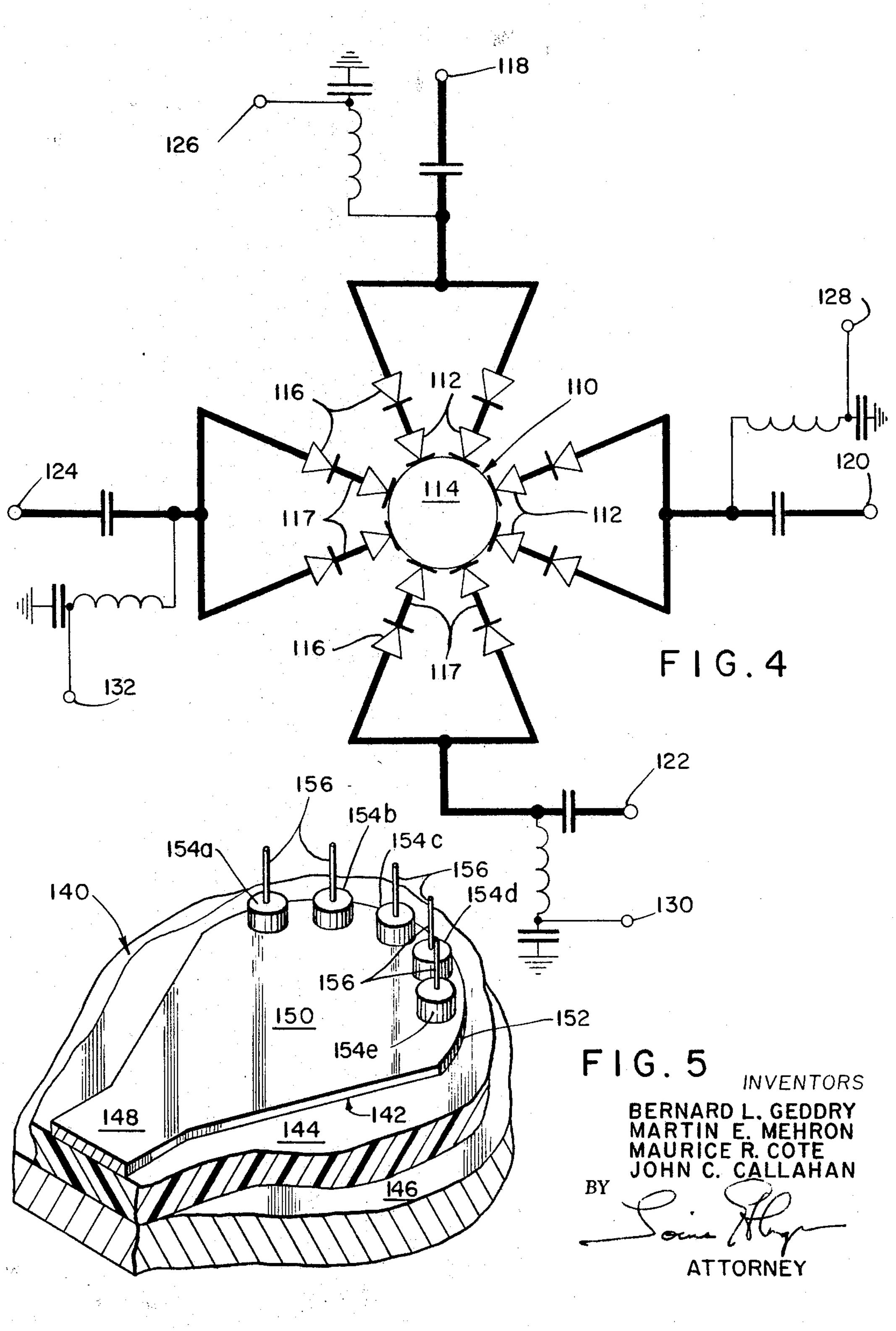
FIG. 4 is a schematic representation of another single-pole four-throw switch.
FIG. 5 is a fragmentary perspective view of another multiple-path diode unit embodying the invention.

As shown in FIG. 4, the isolation of a switch embodying the invention can be increased by connecting an additional diode or like rectifying device in series with each device of the multiple-path diode unit. In particular, FIG. 4 shows an eight-path diode unit 110 having eight diodes 112 connected to a common feed conductor 114 in the same manner that the diodes in FIGS. 1 and 2 are connected to the common post 20. A second diode 116 is in series with each diode 112 and the two series-connected diodes conduct forward current in the same direction.

The additional diodes 116 can be conventional, separately encapsulated diodes connected into the leads of the multiple-path diode unit 110. The length of the lead section 117 intermediate each diode 112 and the additional diode 116 is relatively unimportant. This is because each back-biased diode 112 of the diode unit 110 provides considerable isolation of its associated intermediate lead 117 from the common conductor 114. However, for optimum performance, this intermediate lead section is relatively short in terms of the operating wavelength. In fact, each additional diode 116 can be bonded directly onto the diode 112 in series with and enclosed within the single envelope 30 (FIGS. 1 and 2) of the diode unit.

FIG. 4 also illustrates an arrangement for increasing the power-handling capability of the multiple-path switch by connecting two branch paths of the diode unit 110 in parallel. External microwave circuits are connected to the branch ports 118, 120, 122 and 124 of the FIG. 4 switch in the same manner as in FIG. 3, and control voltages are applied to the switch control terminals 126, 128, 130, 132 and to the common conductor 114 with the same coupling circuitry as shown in FIG. 3.

The efficient operation at high frequencies and over wide frequency ranges provided by the multiple-path diode unit 10 of FIGS. 1 and 2 can also be realized, although possibly to a lesser extent, with a planar diode unit 140 as illustrated in FIG. 5. The common conductor of the planar unit 140 is a strip transmission line inner conductor member 142 spaced by an insulator 144 from a strip line outer conductor 146.

The illustrated inner conductor 142 has a terminal portion 148 at the narrow base of a flared end portion 150.

The peripheral surface 152 of the flared portion, remote from the terminal portion 148, is curved so that all points therealong are relatively equidistant from the terminal portion 148. Junction diodes 154*a*, 154*b*, 154*c*, 154*d*, and 154*e* each have one element—either the anode element or the cathode element—secured and electrically connected to the planar surface of the flared portion 150 adjacent this peripheral surface 152. A lead 156 extends from the other element of each diode. The electrical paths from the terminal portion 148 to the diodes 154—154 therefore have substantially the same lengths; any differences are relatively small compared to the shortest operating wavelength of the diode unit.

Also, the inner conductor member 142 is free of discrete branches leading from the terminal portion to each diode; such branches could, for example, be formed by slotting the end portion 150 along radial paths from its peripheral surface 152 toward the terminal portion 148. Further, the inner conductor member 142 is nonresonant over the range of operating frequencies.

The tapered end portion 150 of the inner conductor member 152 provides a gradual impedance transformation per operating wavelength distance therealong between the terminal portion 148 and the wider peripheral portion to which the diodes are mounted.

A multiple-path diode unit according to the invention can alternatively have a planar common conductor in the form of a circular disk, rather than a segment of such a disk, as in FIG. 5. The full-disk common conductor can be fed at the center of the disk, and the diodes can be disposed adjacent the periphery of the disk.

In summary, the invention described above provides a new and improved microwave component. The inner conductor of the component is a novel, multiple-path diode unit that is readily coupled with an outer conductor structure. The diode unit employs a separate rectifying device for each path so that the signal propagation along each path can be controlled independently from the signals on the other paths. The diode unit is constructed in such a manner that the lead inductance between its common conductor and each rectifying device is largely eliminated. As a result, the upper frequency capability of the multiple-path diode unit is limited by the capacitance of the rectifying devices, rather than by the reactances of the conductors interconnecting the rectifying devices.

The multiple-path diode unit is advantageously used in a microwave switch where it provides unusually wideband operation extending to higher frequencies than prior semiconductor switches of like bandwidth. Moreover, both the multiple-path diode unit and a switch employing it are materially lighter and smaller than the prior art apparatus it replaces.

It will thus be seen that the objects set forth above, among those made apparent from the preceding description, are efficiently attained, and, since certain changes may be made in the above constructions without departing from the scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Having described the invention, what is claimed as new and desired to be secured by Letters Patent is:

1. An electronic component for operation over a range of frequencies, said component comprising:

(a) a first electrical conductor (1) having at least a first terminal portion and at least two surface segments substantially uniformly electrically disposed relative to said terminal portion, and (2) having between said terminal portion and said surface segments a substantially branch-free structure that is essentially electrically nonresonant over said range of frequencies, and (b) at least first and second semiconductor rectifying devices, each of which (1) has an anode element and a cathode element, (2) has a first of said elements adjoined and electrically and mechanically connected to one surface segment of said first conductor so that there is no interconnecting lead therebetween, so that a nonconducting device does not act as an unwanted stub, and (3) is arranged to provide an independently controllable signal path from said terminal portion to said second element thereof.

2. An electronic component according to claim 1:

(a) further comprising a dielectric enclosure around all said rectifying devices and said surface segments of said first conductor, (b) further comprising first and second electrical leads connected respectively to said second elements of said first and second rectifying devices and extending outward from said enclosure, and (c) in which the terminal portion of said first conductor is outside said enclosure.

3. An electronic component according to claim 1 wherein:

(a) said first conductor is an elongated rod having a central longitudinal axis, and (b) said rectifying devices are (1) secured to said rod along a circumferential band disposed substantially in a plane transverse to said axis, and (2) substantially uniformly radially spaced from said axis.

4. An electronic component according to claim 3 in which said rectifying devices are adjacent an end of said elongated rod and intermediate said end and said terminal portion of the rod.

5. An electronic component according to claim 1, further characterized in that said branch-free structure of said first conductor is arranged to present a substantially matched and frequency-independent impedance to said terminal portion over said frequency range when a first group, including one, of said rectifying devices has a substantially frequency-independent impedance matched to the impedance of said terminal portion and each of the other rectifying devices has over said frequency range an impedance substantially greater than the impedance of said terminal portion.

6. Electrical apparatus comprising an electronic component according to claim 5 and means arranged to selectively forward-bias said rectifying devices of said first group and reverse-bias the other diodes.

7. An electronic component according to claim 1 in which each rectifying device is a junction diode.

8. An electronic component according to claim 1 further comprising:

(a) first conductive means coupled with said first conductor and forming therewith a first transmission line in which said first conductor is the inner conductor, and (b) conductive means forming second and third transmission lines, each of which (1) has an inner conductor connected to said second element of a different one of said rectifying devices, and (2) has an outer conductor arranged to be at the same radio frequency potential as the outer conductors of said other transmission lines.

9. An electronic component according to claim 8 in which:

(a) said first conductive means forms a coaxial transmission line outer conductor, and (b) said second and third transmission lines are strip lines.

10. An electronic component according to claim 1 further comprising:

(a) first and second electrical leads connected respectively to said second elements of said first and second rectifying devices, and (b) third and fourth semiconductor rectifying devices respectively in series with said first and second leads and arranged to conduct forward current in the same direction as said first and second rectifying devices respectively in series therewith.

11. An electronic component according to claim 1:

(a) in which there are an even number of semiconductor rectifying devices, each of which has an anode element and a cathode element and has a first of said elements adjoined and electrically connected to said first conductor so that there is no interconnecting leads therebetween, and (b) further comprising conducting means connecting pairs of said rectifying devices in parallel with each other at said second elements.

12. Electrical apparatus comprising:

(a) a first electrical conductor (1) having a feed point and a plurality of surface segments each of which is substantially uniformly electrically spaced from said feed point, (2) said feed point and said surface segments being on a substantially branch-free structure of said first conductor, (b) a plurality of semiconductor rectifying devices, each of which (1) has an anode element and a cathode element, (2) has a first of said elements contiguous to and electrically and mechanically connected to said first conductor at one of said surface segments, so that there is no interconnecting lead therebetween, and so that none of said devices, when rendered nonconducting, acts as an unwanted stub, and (3) has the second of said elements arranged to be electrically isolated from said first conductor, (c) means forming a common return conductor, (d) first circuit means capacitively coupled to each second element, (e) second circuit means capacitively coupled to said first conductor, (1) said first circuit means being selected from the group of circuit means consisting of signal receiving and processing means and signal producing means and said circuit means being the other of said two circuit means, and (f) control means arranged in circuit with said first conductor and with each of said second elements to control the conduction through each of said rectifying devices independent from the conduction through the other of said rectifying devices.

13. Electrical apparatus according to claim 12 in which:

(a) said first conductor is the inner conductor of a first radio frequency transmission line, and (b) a radio frequency transmission line forms the connection between the second element on each rectifying device and said circuit means coupled thereto.

14. Multiple-path electronic apparatus for electrically efficient operation over a relatively wide frequency range extending to relatively high microwave frequencies, said apparatus comprising:

(a) a transmission line inner conductor member having a terminal portion and a plurality of surface segments, (b) means forming a transmission line outer conductor for said inner conductor member (1) the electrical path length along said inner conductor member from said terminal portion thereof to each of said surface segments being substantially uniform, with the differences in the electrical lengths of said paths being small relative to the shortest wavelength within said frequency range, (2) said terminal portion and said surface segments of said inner conductor member forming a branch-free nonresonant structure over said frequency range, and (c) a plurality of semiconductor circuit-controlling devices, each of which (1) has an anode element and a cathode element, (2) has a first of said elements contiguous with and electrically and mechanically connected to one surface segment of said inner conductor member so that there is no interconnecting lead therebetween, and so that, when nonconducting, said devices do not act as unwanted stubs.

15. Electronic apparatus as defined in claim 14 in which said semiconductor devices are rectifying devices.

16. Electronic apparatus as defined in claim 14 in which said inner conductor member has an end removed from said terminal portion thereof and in which said surface segments are adjacent said end of said inner conductor member.

17. Electronic apparatus as defined in claim 14 in which:

(a) said inner conductor member is a substantially cylindrical conductor having a first axial end spaced from said terminal portion, and (b) said surface segments are on a cylindrical surface of said conductor adjacent said first end with said terminal portion being on the other side of said surface segments from said end.

18. A multichannel microwave switch, comprising:

a solid cylindrical inner conductor, a hollow cylindrical outer conductor, said inner conductor and said outer conductor comprising a microwave transmission line, said outer conductor being terminated and outwardly flared approximately at a right angle to form a substantially circular flat section integral therewith, said inner conductor extending beyond said flared end of said outer conductor, a plurality of semiconductors each having an anode electrode and a cathode electrode, one of said electrodes of each of said semiconductors being electrically and mechanically fastened directly to the cylindrical surface of said inner conductor so that there is no interconnecting lead therebetween, and so that, when nonconducting, said semiconductors do not act as unwanted stubs, said semiconductors being fastened in a plane substantially perpendicular to the axis of said inner conductor, extending radially therefrom, and being equally spaced around the periphery thereof, a plurality of strip conductors, one connected to each of the other of said electrodes, extending in a direction radially outward from said inner conductor, parallel and adjacent to, but insulated from, said flat section, and a substantially circular electrically conductive top plate adjacent to, but insulated from, said strip conductors, said top plate being coterminous with said flat section, said top plate and said flat section with said strip conductors comprising a strip transmission line.

References Cited

UNITED STATES PATENTS

| | | | |
|---|---|---|---|
| 2,982,002 | 5/1961 | Shockley. | |
| 3,223,947 | 12/1965 | Clar | 333—7 |
| 3,321,717 | 5/1967 | Harper | 333—7 |
| 3,324,357 | 6/1967 | Hill. | |
| 3,337,820 | 8/1967 | Harper | 333—7 |

OTHER REFERENCES

"Five New Diode Circuits for Nanosecond Microwave Switching," Ravenhill and Smith, Electronics, Aug. 31, 1962, pages 37 to 39 relied upon.

HERMAN KARL SAALBACH, Primary Examiner

M. NUSSBAUM, Assistant Examiner

U.S. Cl. X.R.

333—13; 307—244, 259